(12) United States Patent
Shimizu et al.

(10) Patent No.: US 11,320,099 B2
(45) Date of Patent: May 3, 2022

(54) WAVELENGTH CONVERSION MEMBER AND PRODUCTION METHOD THEREFOR

(71) Applicant: NIPPON ELECTRIC GLASS CO., LTD., Otsu (JP)

(72) Inventors: Hiroyuki Shimizu, Otsu (JP); Hideki Asano, Otsu (JP); Takashi Murata, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 700 days.

(21) Appl. No.: 16/315,699

(22) PCT Filed: Jul. 21, 2017

(86) PCT No.: PCT/JP2017/026511
§ 371 (c)(1),
(2) Date: Jan. 7, 2019

(87) PCT Pub. No.: WO2018/025672
PCT Pub. Date: Feb. 8, 2018

(65) Prior Publication Data
US 2019/0309911 A1    Oct. 10, 2019

(30) Foreign Application Priority Data

Aug. 5, 2016 (JP) .............................. JP2016-154560

(51) Int. Cl.
*C03B 19/06* (2006.01)
*F21K 9/64* (2016.01)
(Continued)

(52) U.S. Cl.
CPC ............... *F21K 9/64* (2016.08); *C03B 19/06* (2013.01); *C03C 4/12* (2013.01); *C03C 14/00* (2013.01);
(Continued)

(58) Field of Classification Search
CPC ................................. C03B 19/06; H01L 33/50
(Continued)

(56) References Cited

U.S. PATENT DOCUMENTS

2008/0303411 A1    12/2008  Ohta et al.
2014/0191271 A1*    7/2014  Maeno ..................... H01L 33/50
                                                                    257/98
(Continued)

FOREIGN PATENT DOCUMENTS

CN        101320776 A     12/2008
CN        105629646 A      6/2016
(Continued)

OTHER PUBLICATIONS

Official Communication issued in corresponding Chinese Patent Application No. 201780047736.6, dated Dec. 31, 2020.
(Continued)

*Primary Examiner* — Christopher M Raabe
(74) *Attorney, Agent, or Firm* — Keating and Bennett, LLP

(57) ABSTRACT

Provided is a wavelength conversion member that can be adjusted in chromaticity readily and with high accuracy and a production method for the wavelength conversion member. A wavelength conversion member 1 having a first principal surface 1a and a second principal surface 1b opposed to each other includes a glass matrix 2 and phosphor particles 3 disposed in the glass matrix 2, wherein a concentration of the phosphor particles 3 in the first principal surface 1a is higher than a concentration of the phosphor particles 3 in a portion 20 μm inward from the first principal surface 1a, a concentration of the phosphor particles 3 in the second principal surface 1b is lower than a concentration of the phosphor particles 3 in a portion 20 μm inward from the second principal surface 1b, and the concentration of the
(Continued)

phosphor particles 3 in the first principal surface 1a is higher than the concentration of the phosphor particles 3 in the second principal surface 1b.

4 Claims, 4 Drawing Sheets

(51) Int. Cl.
| | | |
|---|---|---|
| *C03C 4/12* | (2006.01) | |
| *C03C 14/00* | (2006.01) | |
| *F21V 9/08* | (2018.01) | |
| *H01L 33/50* | (2010.01) | |
| *F21V 9/00* | (2018.01) | |
| *G02B 5/20* | (2006.01) | |

(52) U.S. Cl.
CPC .............. *C03C 14/004* (2013.01); *F21V 9/00* (2013.01); *F21V 9/08* (2013.01); *G02B 5/20* (2013.01); *H01L 33/50* (2013.01)

(58) Field of Classification Search
USPC .................................................. 252/301.4 F
See application file for complete search history.

(56) References Cited

U.S. PATENT DOCUMENTS

| | | |
|---|---|---|
| 2016/0027971 A1 | 1/2016 | Anc |
| 2016/0147136 A1 | 5/2016 | Nojima |
| 2016/0238922 A1 | 8/2016 | Furuyama et al. |
| 2016/0377967 A1 | 12/2016 | Ando et al. |

FOREIGN PATENT DOCUMENTS

| | | |
|---|---|---|
| JP | 2003-258308 A | 9/2003 |
| JP | 2004-186488 A | 7/2004 |
| JP | 2014-015359 A | 1/2014 |
| JP | 2015-215583 A | 12/2015 |
| JP | 2016-099558 A | 5/2016 |
| WO | 2015/098602 A1 | 7/2015 |

OTHER PUBLICATIONS

Official Communication issued in European Patent Application No. 17836778.5, dated Jan. 13, 2020.
Official Communication issued in International Patent Application No. PCT/JP2017/026511, dated Oct. 24, 2017.

\* cited by examiner

[FIG. 1]
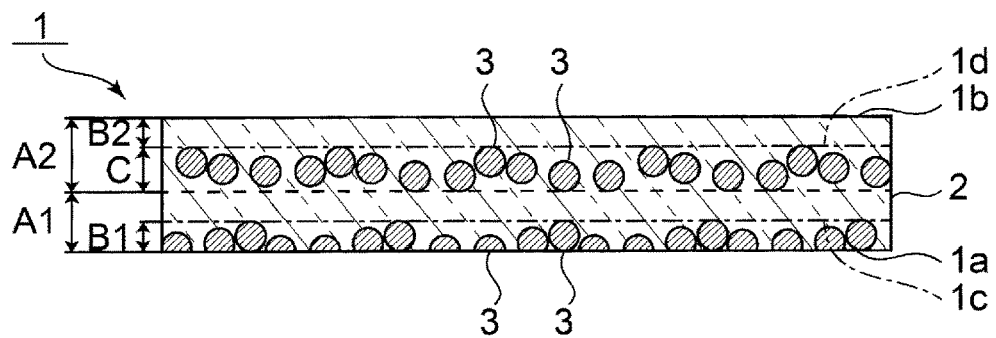
[FIG. 2]
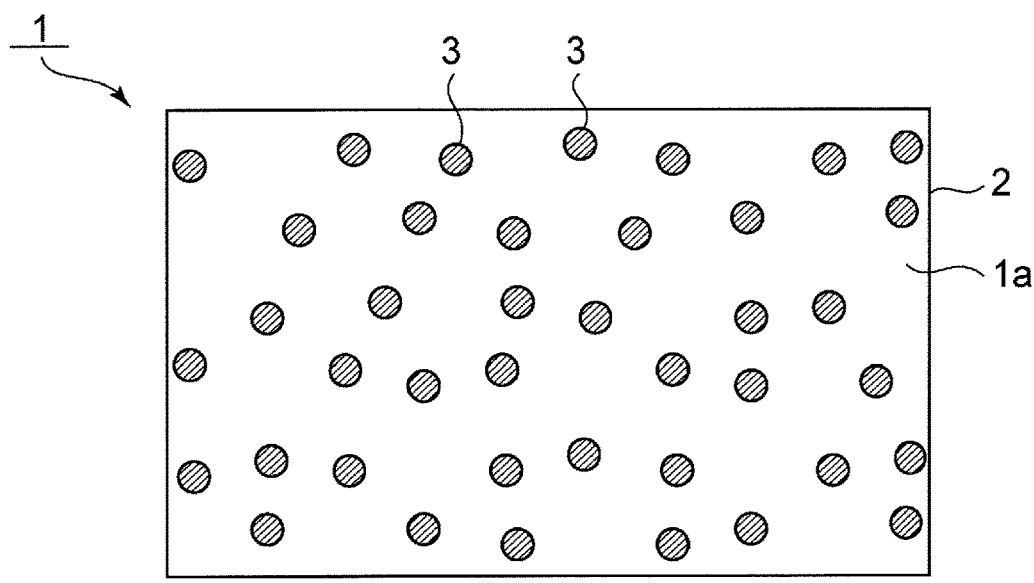
[FIG. 3]
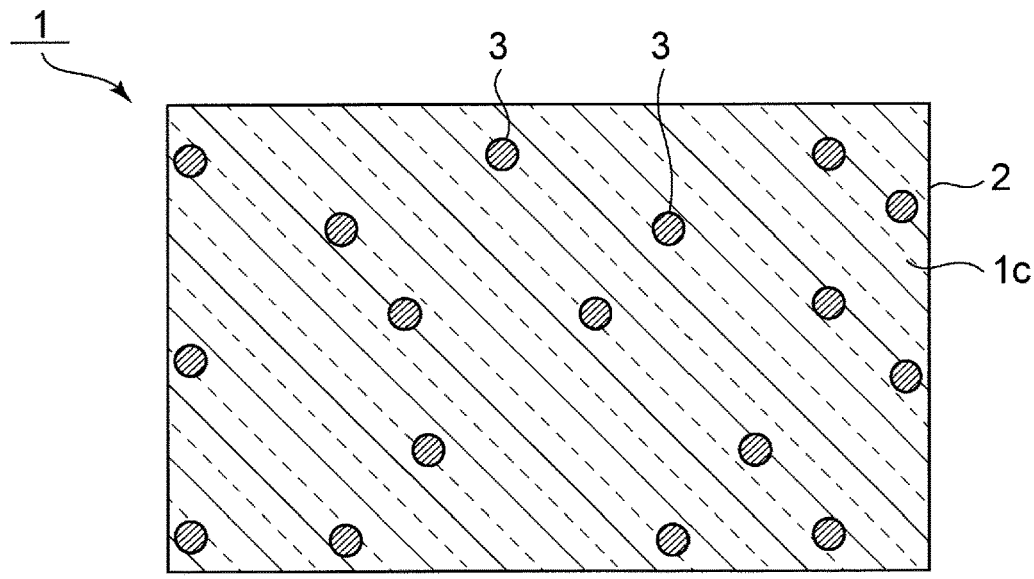

[FIG. 4]
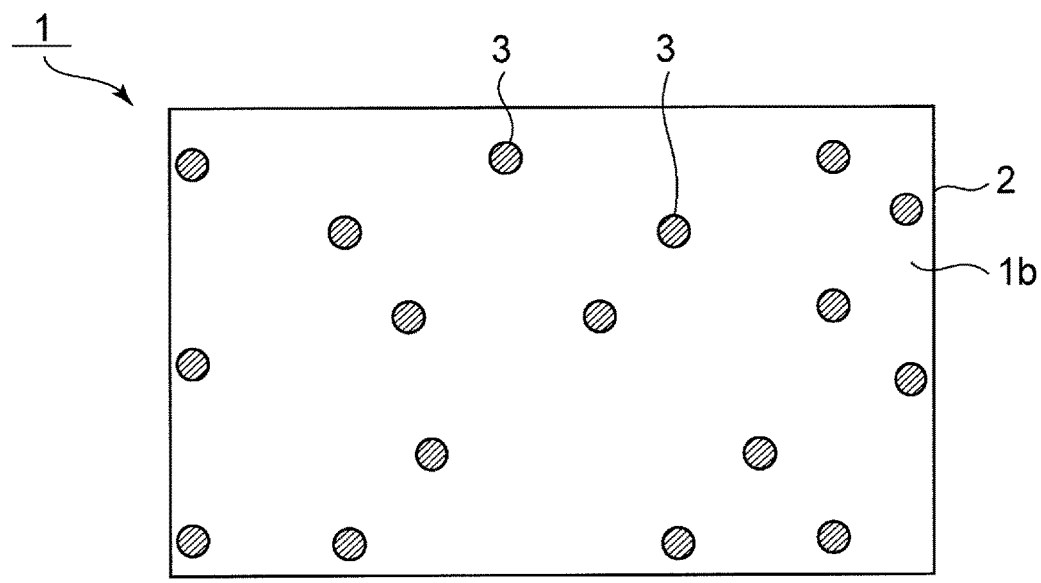
[FIG. 5]
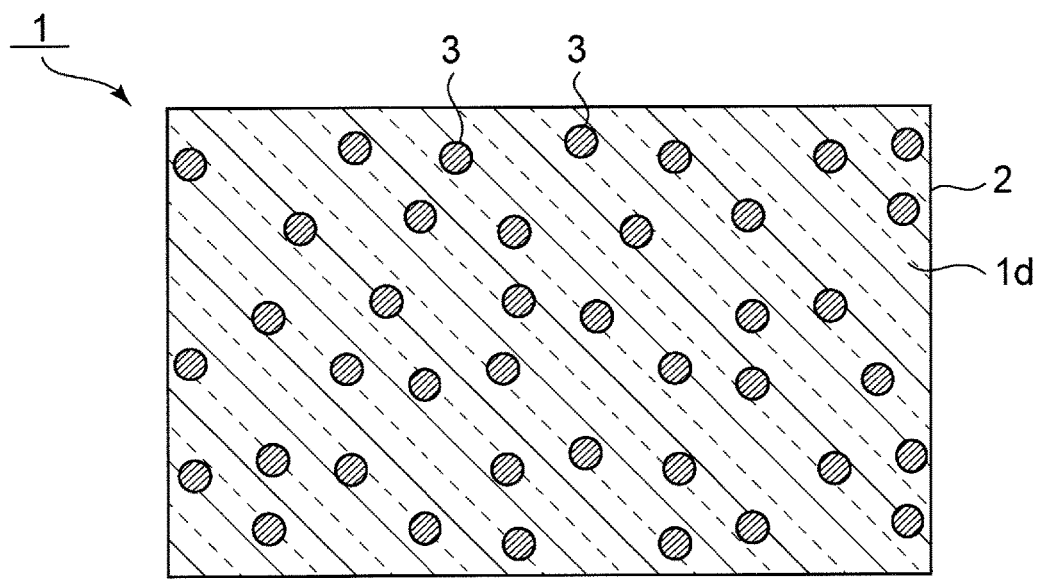

[FIG. 6]
(a)
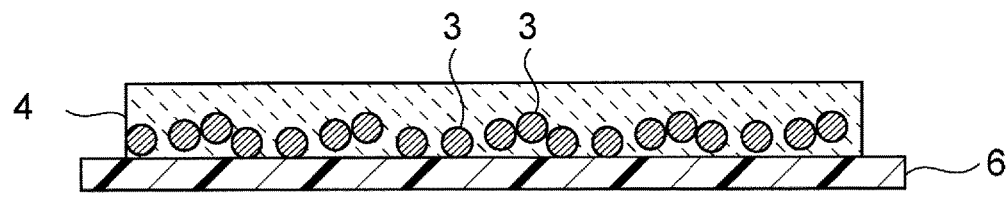
(b)
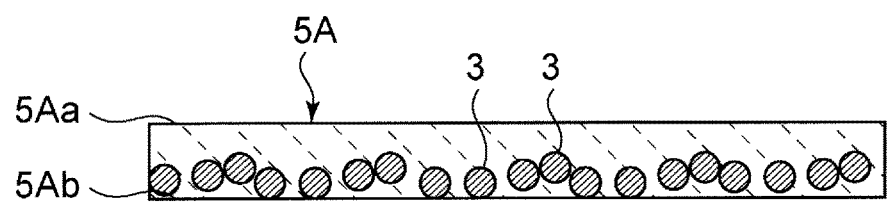
(c)
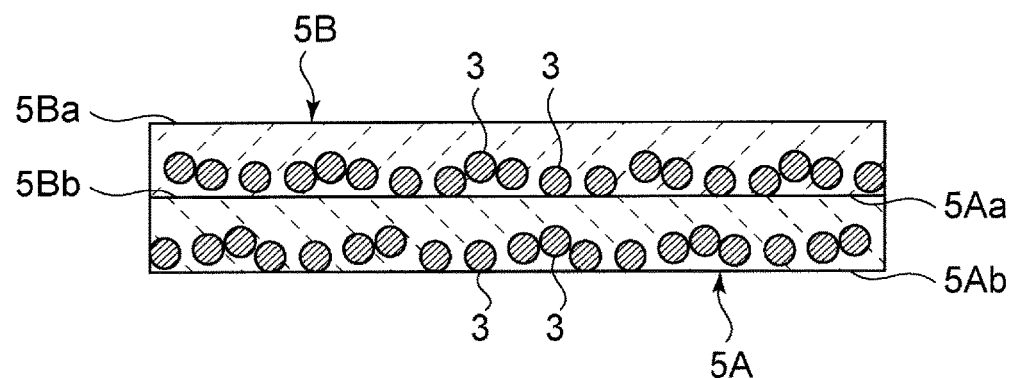
(d)
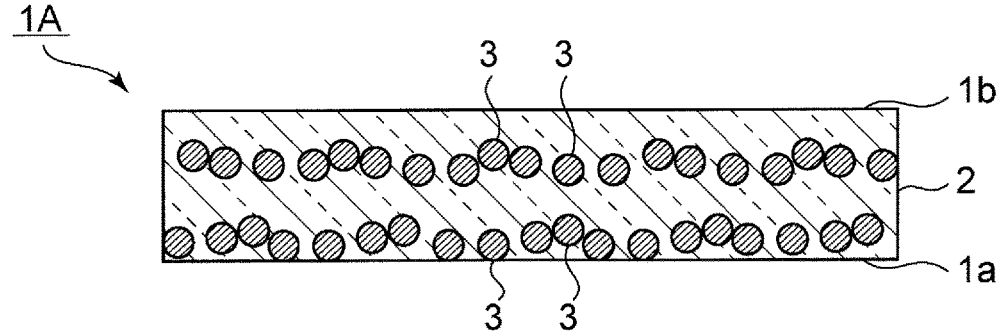

[FIG. 7]
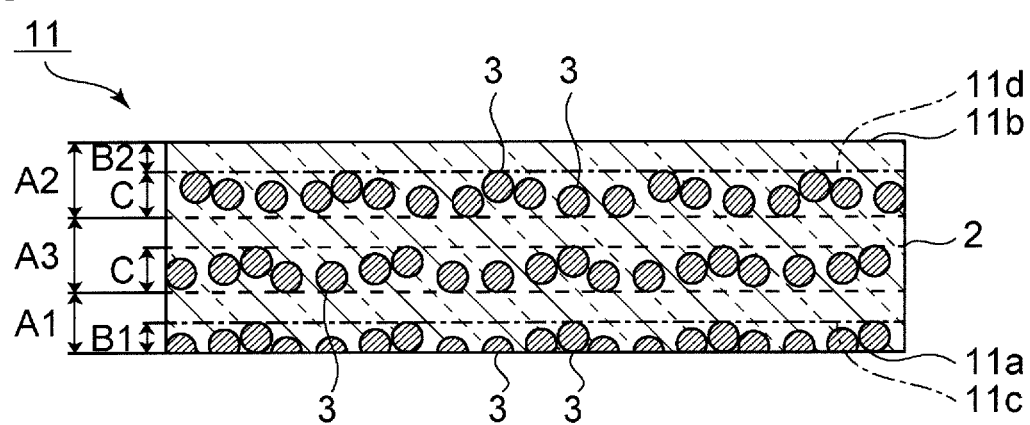

WAVELENGTH CONVERSION MEMBER AND PRODUCTION METHOD THEREFOR

TECHNICAL FIELD

The present invention relates to wavelength conversion members for converting the wavelength of light emitted from a light emitting diode (LED), a laser diode (LD) or the like to another wavelength and production methods therefor.

BACKGROUND ART

Recently, attention has been increasingly focused on light emitting devices and the like using LEDs or LDs, as next-generation light sources to replace fluorescence lamps and incandescent lamps. As an example of such a next-generation light source, there is a disclosure of a light emitting device in which an LED for emitting a blue light is combined with a wavelength conversion member capable of absorbing part of the light from the LED to convert it to a yellow light. This light emitting device emits a white light which is a synthesized light of the blue light emitted from the LED and the yellow light emitted from the wavelength conversion member. Patent Literature 1 proposes, as an example of a wavelength conversion member, a wavelength conversion member in which phosphor powder is dispersed in a glass matrix.

CITATION LIST

Patent Literature

[PTL 1]
JP-A-2003-258308

SUMMARY OF INVENTION

Technical Problem

Such a wavelength conversion member as described in Patent Literature 1 is made by polishing a glass-based material including phosphor powder dispersed in a glass matrix to reduce its thickness. However, wavelength conversion members obtained in this manner often show variations in luminescent color (chromaticity variations). Therefore, there are cases where wavelength conversion members having a desired chromaticity cannot accurately be obtained. Furthermore, the amount of glass-based material ground away for obtaining a wavelength conversion member having a desired chromaticity may become large, so that productivity cannot sufficiently be increased.

An object of the present invention is to provide a wavelength conversion member that can be adjusted in chromaticity readily and with high accuracy and a production method for the wavelength conversion member.

Solution to Problem

A wavelength conversion member according to the present invention is a wavelength conversion member having a first principal surface and a second principal surface opposed to each other and includes a glass matrix and phosphor particles disposed in the glass matrix, wherein a concentration of the phosphor particles in the first principal surface is higher than a concentration of the phosphor particles in a portion 20 μm inward from the first principal surface, a concentration of the phosphor particles in the second principal surface is lower than a concentration of the phosphor particles in a portion 20 μm inward from the second principal surface, and the concentration of the phosphor particles in the first principal surface is higher than the concentration of the phosphor particles in the second principal surface.

In the present invention, the wavelength conversion member may include a plurality of regions each having a concentration of the phosphor particles decreasing from a side closer to the first principal surface toward a side closer to the second principal surface and the plurality of regions may be continuously provided from the first principal surface toward the second principal surface.

A method for producing a wavelength conversion member according to the present invention is a method for producing the wavelength conversion member constructed according to the present invention and includes the steps of: preparing a slurry containing glass particles to be the glass matrix and the phosphor particles; applying the slurry to substrates, drying the slurry, and allowing the phosphor particles to sediment downward before completion of the drying to obtain first and second green sheets in each of which a concentration of the phosphor particles in an under surface is higher than a concentration of the phosphor particles in a top surface; and stacking the first and second green sheets so as to superpose the top surface of the first green sheet and the under surface of the second green sheet and bonding and firing the first and second green sheets together.

The method preferably further includes the step of polishing the first principal surface and/or the second principal surface of the wavelength conversion member.

Advantageous Effects of Invention

The present invention enables provision of a wavelength conversion member capable of being adjusted in chromaticity readily and with high accuracy and a production method for the wavelength conversion member.

BRIEF DESCRIPTION OF DRAWINGS

FIG. 1 is a schematic cross-sectional front view of a wavelength conversion member according to a first embodiment of the present invention.

FIG. 2 is a schematic plan view showing the concentration of phosphor particles in a first principal surface of the wavelength conversion member according to the first embodiment of the present invention.

FIG. 3 is a schematic cross-sectional plan view showing the concentration of phosphor particles in a surface layer bottom plane 20 μm inward from the first principal surface of the wavelength conversion member according to the first embodiment of the present invention.

FIG. 4 is a schematic plan view showing the concentration of phosphor particles in a second principal surface of the wavelength conversion member according to the first embodiment of the present invention.

FIG. 5 is a schematic cross-sectional plan view showing the concentration of phosphor particles in a surface layer bottom plane 20 μm inward from the second principal surface of the wavelength conversion member according to the first embodiment of the present invention.

FIGS. 6(a) to 6(d) are schematic cross-sectional front views for illustrating an example of a method for producing the wavelength conversion member according to the first embodiment of the present invention.

FIG. 7 is a schematic cross-sectional front view of a wavelength conversion member according to a second embodiment of the present invention.

DESCRIPTION OF EMBODIMENTS

Hereinafter, a description will be given of preferred embodiments. However, the following embodiments are merely illustrative and the present invention is not limited to the following embodiments. Throughout the drawings, members having substantially the same functions may be referred to by the same reference characters.

First Embodiment

FIG. 1 is a schematic cross-sectional front view of a wavelength conversion member according to a first embodiment of the present invention. As shown in FIG. 1, a wavelength conversion member 1 includes a glass matrix 2 and phosphor particles 3 disposed in the glass matrix 2. The wavelength conversion member 1 has first and second principal surfaces 1a, 1b opposed to each other.

In this embodiment, excitation light enters the wavelength conversion member 1 through one of the first principal surface 1a and the second principal surface 1b. The phosphor particles 3 emit fluorescence due to entry of the excitation light. The fluorescence and the excitation light exit the wavelength conversion member 1 through the other of the first principal surface 1a and the second principal surface 1b. Note that in this embodiment the direction in which the first principal surface 1a and the second principal surface 1b are opposed to each other is a thickness direction.

No particular limitation is placed on the type of the glass matrix 2 so long as it can be used as a dispersion medium for the phosphor particles 3, such as inorganic phosphor. For example, borosilicate glass, phosphate, tin-phosphate glass or bismuthate glass can be used. Examples of the borosilicate glass include those containing, in % by mass, 30 to 85% $SiO_2$, 0 to 30% $Al_2O_3$, 0 to 50% $B_2O_3$, 0 to 10% $Li_2O+Na_2O+K_2O$, and 0 to 50% MgO+CaO+SrO+BaO. Examples of the tin-phosphate glass include those containing, in % by mole, 30 to 90% SnO and 1 to 70% $P_2O_5$. The softening point of the glass matrix 2 is preferably 250° C. to 1000° C., more preferably 300° C. to 950° C., and still more preferably in a range of 500° C. to 900° C. If the softening point of the glass matrix 2 is too low, the mechanical strength and chemical durability of the wavelength conversion member 1 may decrease. Furthermore, because the thermal resistance of the glass matrix 2 itself decreases, the wavelength conversion member 1 may be softened and deformed by heat generated by the phosphor particles 3. On the other hand, if the softening point of the glass matrix 2 is too high, the phosphor particles 3 may be deteriorated by a firing process during production, so that the luminescence intensity of the wavelength conversion member 1 may decrease. The glass matrix 2 is preferably alkali-free glass. Thus, deactivation of the phosphor particles 3 can be prevented. From the viewpoint of increasing the mechanical strength and chemical durability of the wavelength conversion member 1, the softening point of the glass matrix 2 is preferably not less than 500° C., more preferably not less than 600° C., still more preferably not less than 700° C., yet still more preferably not less than 800° C., and particularly preferably not less than 850° C. An example of such a glass is borosilicate glass. However, if the softening point of the glass matrix 2 rises, the firing temperature also rises and, as a result, the production cost tends to rise. Therefore, from the viewpoint of inexpensively producing the wavelength conversion member 1, the softening point of the glass matrix 2 is preferably not more than 550° C., more preferably not more than 530° C., still more preferably not more than 500° C., yet still more preferably not more than 480° C., and particularly preferably not more than 460° C. Examples of such a glass include tin-phosphate glass and bismuthate glass.

No particular limitation is placed on the type of the phosphor particles 3 so long as they emit fluorescence upon entry of excitation light. A specific example of the type of the phosphor particles 3 is one or more selected from the group consisting of oxide phosphor, nitride phosphor, oxynitride phosphor, chloride phosphor, oxychloride phosphor, sulfide phosphor, oxysulfide phosphor, halide phosphor, chalcogenide phosphor, aluminate phosphor, halophosphoric acid chloride phosphor, and garnet-based compound phosphor. When using a blue light as the excitation light, for example, a phosphor emitting a green light, a yellow light or a red light as fluorescence can be used.

The average particle diameter of the phosphor particles 3 is preferably 1 μm to 50 μm and more preferably 5 μm to 25 μm. If the average particle diameter of the phosphor particles 3 is too small, the luminescence intensity may decrease. On the other hand, if the average particle diameter of the phosphor particles 3 is too large, the luminescent color may be uneven.

The content of the phosphor particles 3 in the glass matrix 2 is preferably in a range of 1 to 70% by volume, more preferably in a range of 1.5 to 50% by volume, and still more preferably in a range of 2 to 30% by volume. If the content of the phosphor particles 3 is too small, the luminescence intensity of the wavelength conversion member 1 may be insufficient. On the other hand, if the content of the phosphor particles 3 is too large, a desired luminescent color may not be able to be obtained. In addition, the mechanical strength of the wavelength conversion member 1 may decrease.

The thickness of the wavelength conversion member 1 is preferably in a range of 0.01 mm to 1 mm, more preferably in a range of 0.03 mm to 0.5 mm, still more preferably in a range of 0.05 mm to 0.35 mm, particularly preferably in a range of 0.075 mm to 0.3 mm, and most preferably in a range of 0.1 mm to 0.25 mm. If the thickness of the wavelength conversion member 1 is too large, scattering and absorption of light in the wavelength conversion member 1 may become too much, so that the efficiency of emission of fluorescence may become low. If the thickness of the wavelength conversion member 1 is too small, sufficient luminescence intensity may be less likely to be obtained. In addition, the mechanical strength of the wavelength conversion member 1 may be insufficient.

A feature of this embodiment is that the concentration of phosphor particles 3 in the first principal surface 1a is higher than the concentration of phosphor particles 3 in a portion 20 μm inward from the first principal surface 1a, the concentration of phosphor particles 3 in the second principal surface 1b is lower than the concentration of phosphor particles 3 in a portion 20 μm inward from the second principal surface 1b, and the concentration of phosphor particles 3 in the first principal surface 1a is higher than the concentration of phosphor particles 3 in the second principal surface 1b. A description will be given of the feature of this embodiment with reference to FIGS. 1 to 5.

As shown in FIG. 1, in this embodiment, a plane of the wavelength conversion member 1 located 20 μm inward from the first principal surface 1a is referred to as a surface layer bottom plane 1c. Likewise, a plane of the wavelength conversion member 1 located 20 μm inward from the second principal surface 1b is referred to as a surface layer bottom plane 1d. A region from the first principal surface 1a to the surface layer bottom plane 1c is a surface layer B1 in this embodiment. A region from the second principal surface 1b to the surface layer bottom plane 1d is a surface layer B2 in this embodiment.

FIG. 2 is a schematic plan view showing the concentration of phosphor particles 3 in the first principal surface 1a. FIG. 3 is a schematic cross-sectional plan view showing the concentration of phosphor particles 3 in the surface layer bottom plane 1c located 20 μm inward from the first principal surface 1a. As shown in FIGS. 2 and 3, the area occupancy of phosphor particles 3 in the surface layer bottom plane 1c is smaller than that of phosphor particles 3 in the first principal surface 1a. Therefore, the concentration of phosphor particles 3 in the first principal surface 1a is higher than that of phosphor particles 3 in the surface layer bottom plane 1c located 20 μm inward from the first principal surface 1a.

FIG. 4 is a schematic plan view showing the concentration of phosphor particles 3 in the second principal surface 1b. FIG. 5 is a schematic cross-sectional plan view showing the concentration of phosphor particles 3 in the surface layer bottom plane 1d located 20 μm inward from the second principal surface 1b. As shown in FIGS. 4 and 5, the area occupancy of phosphor particles 3 in the second principal surface 1b is smaller than that of phosphor particles 3 in the surface layer bottom plane 1d. Therefore, the concentration of phosphor particles 3 in the second principal surface 1b is lower than that of phosphor particles 3 in the surface layer bottom plane 1d located 20 μm inward from the second principal surface 1b.

As shown in FIGS. 2 and 4, the concentration of phosphor particles 3 in the first principal surface 1a is higher than that of phosphor particles 3 in the second principal surface 1b.

The area occupancy of phosphor particles 3 in the first principal surface 1a is preferably not less than 140% of the area occupancy of phosphor particles 3 in the surface layer bottom plane 1c, more preferably not less than 160% thereof, still more preferably not less than 200% thereof, preferably not more than 1000% thereof, more preferably not more than 500% thereof, and still more preferably not more than 330% thereof. If the area occupancy is too small, the amount of change in chromaticity upon polishing of the first principal surface 1a is too small, so that the production efficiency tends to decrease. On the other hand, if the area occupancy is too large, the amount of change in chromaticity upon polishing of the first principal surface 1a is too large, which makes it difficult to adjust the chromaticity with high accuracy.

The area occupancy of phosphor particles 3 in the second principal surface 1b is preferably not less than 10% of the area occupancy of phosphor particles 3 in the surface layer bottom plane 1d, more preferably not less than 20% thereof, still more preferably not less than 30% thereof, preferably not more than 70% thereof, more preferably not more than 60% thereof, and still more preferably not more than 50% thereof. If the area occupancy is too small, the amount of change in chromaticity upon polishing of the second principal surface 1b is too small, so that the production efficiency tends to decrease. On the other hand, if the area occupancy is too large, the amount of change in chromaticity upon polishing of the second principal surface 1b is too large, which makes it difficult to adjust the chromaticity with high accuracy.

The area occupancy of phosphor particles 3 in the first principal surface 1a is preferably not less than 140% of the area occupancy of phosphor particles 3 in the second principal surface 1b, more preferably not less than 160% thereof, still more preferably not less than 200% thereof, preferably not more than 1000% thereof, more preferably not more than 500% thereof, and still more preferably not more than 330% thereof. If the area occupancy is within the above range, the effect of enabling the chromaticity to be adjusted readily and with high accuracy according to the present invention is more likely to be achieved.

The area occupancy is calculated by digitizing each of SEM (scanning electron microscopic) images of the principal surfaces and surface layer bottom planes and determining the proportion of the area of portions occupied by phosphor particles per unit area of the image. As for the surface layer bottom planes, their images are taken with the surface layer bottom planes exposed by polishing the principal surfaces.

As shown in FIG. 1, the wavelength conversion member 1 according to this embodiment includes first and second regions A1, A2. In each of the first and second regions A1 and A2, the concentration of phosphor particles 3 decreases from the side closer to the first principal surface 1a toward the side closer to the second principal surface 1b. The first region A1 includes the first principal surface 1a and the second region A2 includes the second principal surface 1b. The first region A1 and the second region A2 are continuously provided from the first principal surface 1a toward the second principal surface 1b.

More specifically, the first region A1 has a concentration gradient in which the concentration of phosphor particles 3 gradually decreases from the first principal surface 1a toward the side closer to the second principal surface 1b. Therefore, the surface layer B1 has a concentration gradient in which the concentration of phosphor particles 3 gradually increases toward the first principal surface 1a. On the other hand, the second region A2 has a concentration gradient in which the concentration of phosphor particles 3 gradually decreases from the side closer to the first principal surface 1a toward the second principal surface 1b. Therefore, the surface layer B2 has a concentration gradient in which the concentration of phosphor particles 3 gradually decreases toward the second principal surface 1b.

The wavelength conversion member 1 is used for the purpose of converting the wavelength of entered excitation light and emitting fluorescence. In the case of a white light emitting device, a white light, for example, which is a synthesized light of a blue light as excitation light from a light source, such as an LED, and a yellow light as fluorescence, is emitted from the wavelength conversion member 1. The adjustment of the chromaticity of light to be emitted from the wavelength conversion member 1 is generally achieved by polishing at least one of the first principal surface 1a and the second principal surface 1b of the wavelength conversion member 1 to reduce the thickness of the wavelength conversion member 1. By reducing the thickness of the wavelength conversion member 1, the proportion of fluorescence emitted from the wavelength conversion member 1 can be reduced and the proportion of excitation light passing through the wavelength conversion member 1 can be increased. The adjustment of the thickness of the wavelength conversion member 1 is generally achieved by polishing within the regions of the surface layers B1, B2.

In this embodiment, the concentration of phosphor particles 3 in the first principal surface 1a is higher than that of phosphor particles 3 in the surface layer bottom plane 1c. Therefore, the change in chromaticity relative to the change in thickness due to polishing of the first principal surface 1a is large. In other words, on the first principal surface 1a side, the chromaticity can be largely changed even if the amount of material ground away by polishing is small and, therefore, the chromaticity can be readily adjusted. On the other hand, the concentration of phosphor particles 3 in the second principal surface 1b is lower than that of phosphor particles 3 in the surface layer bottom plane 1d. Therefore, the change in chromaticity relative to the change in thickness due to polishing of the second principal surface 1b is small. In other words, on the second principal surface 1b side, the chromaticity can be slightly changed relative to the change in thickness by polishing and can be thus fine-adjusted.

For the above reasons, in adjusting the chromaticity, it is possible that the first principal surface 1a is first polished to adjust the chromaticity to nearly a desired chromaticity and the second principal surface 1b is then polished to fine-adjust the chromaticity. Hence, according to this embodiment, the chromaticity can be adjusted readily and with high accuracy.

As shown in FIG. 1, in the second region A2, the concentration of phosphor particles 3 in the portion inside from the surface layer bottom plane 1d is higher than that of phosphor particles 3 in the surface layer bottom plane 1d. Specifically, other than in the vicinity of the first principal surface 1a, the wavelength conversion member 1 also has, between the surface layer bottom plane 1c and the surface layer bottom plane 1d, a region C where the concentration of phosphor particles 3 is higher than that of phosphor particles 3 in the surface layer bottom plane 1d. In the absence of the region C having a high concentration of phosphor particles 3, a portion containing phosphor particles 3 and a portion free of phosphor particles 3 in the inside of the wavelength conversion member 1 have different degrees of scattering of excitation light and different degrees of wavelength conversion. Therefore, the luminescent color of the wavelength conversion member 1 tends to be uneven. For example, when the portion free of phosphor particles 3 is irradiated with excitation light, there may occur a phenomenon in which the excitation light directly passes through the portion without scattering and wavelength conversion, a so-called "passing through of excitation light". On the other hand, in the presence of the region C having a high concentration of phosphor particles 3, excitation light having directly passed through the surface layer of the wavelength conversion member 1 is likely to be scattered or converted in wavelength in the region C, so that the color evenness of the wavelength conversion member 1 is likely to be increased.

Furthermore, since the wavelength conversion member 1 includes a plurality of regions having a high concentration of phosphor particles 3, the content of phosphor particles 3 in the wavelength conversion member 1 can be made sufficient without excessively increasing the concentration of phosphor particles 3 in the vicinity of the first principal surface 1a. Therefore, the deterioration of the mechanical strength in the vicinity of the first principal surface 1a is less likely to occur and the content of phosphor particles 3 in the wavelength conversion member 1 can be more securely made sufficient.

Although in FIG. 1 the phosphor particles 3 are not shown in the surface layer B2, the surface layer B2 may also contain the phosphor particles 3 as shown in FIG. 4. Other than the surface layer B2, any portion where the phosphor particles 3 are not shown may likewise contain the phosphor particles 3. For the purpose of showing a high concentration of phosphor particles 3 in the surface layer B1 and the region C, FIG. 1 shows the phosphor particles 3 in the surface layer B1 and the region C only.

Hereinafter, a description will be given of an example of a method for producing the wavelength conversion member 1.

(Method for Producing Wavelength Conversion Member)

FIGS. 6(a) to 6(d) are schematic cross-sectional front views for illustrating an example of a method for producing the wavelength conversion member according to the first embodiment.

In the method for producing the wavelength conversion member 1, first, a slurry is prepared which contains glass particles to be a glass matrix, phosphor particles, and organic components including a binder resin and a solvent. Next, as shown in FIG. 6(a), the slurry 4 is applied onto a resin film 6 made of polyethylene terephthalate or other resins and serving as a substrate, by the doctor blade method or other methods.

Next, the slurry 4 is dried. In doing so, the phosphor particles 3 are allowed to sediment downward before the completion of the drying of the slurry 4. Thus, as shown in FIG. 6(b), a first green sheet 5A is obtained in which the concentration of phosphor particles 3 in the under surface 5Ab is higher than the concentration of phosphor particles 3 in the top surface 5Aa.

Note that the density of glass particles in the slurry 4 is smaller than the density of phosphor particles 3 therein. Therefore, the phosphor particles 3 can be suitably allowed to sediment. Thus, in the first green sheet 5A, the above-mentioned concentration distribution of the phosphor particles 3 can be more securely achieved.

On the other hand, a second green sheet 5B shown in FIG. 6(c) is obtained in the same manner as the process shown in FIGS. 6(a) and 6(b). Also in the second green sheet 5B, the concentration of phosphor particles 3 in the under surface 5Bb is higher than the concentration of phosphor particles 3 in the top surface 5Ba.

Next, as shown in FIG. 6(c), the first and second green sheets 5A, 5B are stacked so as to superpose the top surface 5Aa of the first green sheet 5A on the under surface 5Bb of the second green sheet 5B. Next, the first and second green sheets 5A, 5B are bonded together by the application of heat and pressure and fired. Thus, a wavelength conversion member 1A shown in FIG. 6(d) is produced.

In addition, both or one of the first principal surface 1a and the second principal surface 1b of the wavelength conversion member 1A may be polished to adjust the chromaticity of the wavelength conversion member 1A. In the first embodiment, the first and second principal surfaces 1a, 1b are polished, thus obtaining the wavelength conversion member 1 shown in FIG. 1. No particular limitation is placed on the polishing method and it can be provided, for example, by lapping or mirror polishing. Lapping has the advantage of having a higher polishing speed than mirror polishing. On the other hand, mirror polishing can increase the accuracy of a polished surface as compared to lapping. The thickness and chromaticity of the wavelength conversion member 1 have a correlation. Therefore, if this correlation is previously determined, a target thickness of the wavelength conversion member 1 for obtaining a desired chromaticity can be determined. The correlation between the thickness and the chromaticity can be determined, for example, by measuring the thickness and chromaticity while keeping on polishing in conditions of higher chromaticity than a target chromaticity. In this case, from the viewpoint of determining the correlation between chromaticity and thickness with high accuracy, it is preferred to adopt a polishing method providing a surface condition (surface roughness) equivalent to that of the finished surface of a final product. For example, if the product is finished by mirror polishing, mirror polishing is preferably also adopted in the polishing method for determining the correlation between chromaticity and thickness.

Second Embodiment

FIG. 7 is a schematic cross-sectional front view of a wavelength conversion member according to a second embodiment. A wavelength conversion member 11 according to this embodiment can be produced by stacking not only the first and second green sheets 5A, 5B shown in FIG. 6(*c*) but also a third green sheet made in the same manner as for the first and second green sheets 5A, 5B. Specifically, the wavelength conversion member 11 can be produced by laying the top surface of the third green sheet, the top surface having a lower concentration of phosphor particles 3, on the first green sheet 5A side of the laminate of the first and second green sheets 5A, 5B and bonding and firing them together. Alternatively, the under surface of the third green sheet, the under surface having a higher concentration of phosphor particles 3, may be laid on the second green sheet 5B side of the laminate.

Also in this embodiment, the concentration of phosphor particles 3 in a first principal surface 11*a* is higher than the concentration of phosphor particles 3 in a surface layer bottom plane 11*c*. The concentration of phosphor particles 3 in a second principal surface 11*b* is lower than the concentration of phosphor particles 3 in a surface layer bottom plane 11*d*. Furthermore, the concentration of phosphor particles 3 in the first principal surface 11*a* is higher than the concentration of phosphor particles 3 in the second principal surface 11*b*. Therefore, it is possible that the first principal surface 11*a* is first polished to adjust the chromaticity to nearly a desired chromaticity and the second principal surface 11*b* is then polished to fine-adjust the chromaticity. Hence, the chromaticity can be adjusted readily and with high accuracy.

In addition, the wavelength conversion member 11 includes first to third regions A1 to A3 each having a concentration of phosphor particles 3 decreasing from the side closer to the first principal surface 11*a* toward the side closer to the second principal surface 11*b*. The first region A1, the third region A3, and the second region A2 are continuously provided in this order from the first principal surface 11*a* toward the second principal surface 11*b*. Although the wavelength conversion member 11 includes three regions each having a concentration of phosphor particles 3 decreasing from the side closer to the first principal surface 11*a* toward the side closer to the second principal surface 11*b*, the wavelength conversion member may include four or more such regions.

The wavelength conversion member 11 has, between the surface layer bottom plane 11*c* and the surface layer bottom plane 11*d*, a plurality of regions C where the concentration of phosphor particles 3 is higher than that of phosphor particles 3 in the surface layer bottom plane 11*d*. Therefore, the above-described effect of increasing the color evenness can be more likely to be obtained. Furthermore, like the first embodiment, the deterioration of the mechanical strength in the vicinity of the first principal surface 11*a* is less likely to occur and the content of phosphor particles 3 can be more securely made sufficient.

In the third region A3, the concentration of phosphor particles 3 may increase from the side closer to the first principal surface 11*a* toward the side closer to the second principal surface 11*b*.

REFERENCE SIGNS LIST

1, 1A . . . wavelength conversion member
1*a*, 1*b* . . . first and second principal surfaces
1*c*, 1*d* . . . surface layer bottom planes
2 . . . glass matrix
3 . . . phosphor particle
4 . . . slurry
5A . . . first green sheet
5Aa . . . top surface
5Ab . . . under surface
5B . . . second green sheet
5Ba . . . top surface
5Bb . . . under surface
6 . . . resin film
11 . . . wavelength conversion member
11*a*, 11*b* . . . first and second principal surfaces
11*c*, 11*d* . . . surface layer bottom plane
A1-A3 . . . first to third regions
B1, B2 . . . surface layer
C . . . region

The invention claimed is:

1. A method for producing a wavelength conversion member having a first principal surface and a second principal surface opposed to each other, the wavelength conversion member comprising:
    a glass matrix; and
    phosphor particles disposed in the glass matrix, wherein
    a concentration of the phosphor particles in the first principal surface is higher than a concentration of the phosphor particles in a portion 20 μm inward from the first principal surface,
    a concentration of the phosphor particles in the second principal surface is lower than a concentration of the phosphor particles in a portion 20 μm inward from the second principal surface, and
    the concentration of the phosphor particles in the first principal surface is higher than the concentration of the phosphor particles in the second principal surface,
    the method comprising the steps of:
    preparing a slurry containing glass particles to be the glass matrix and the phosphor particles;
    applying the slurry, drying the slurry, and allowing the phosphor particles to sediment downward before completion of the drying to obtain first and second green sheets in each of which a concentration of the phosphor particles in an under surface is higher than a concentration of the phosphor particles in a top surface; and
    stacking the first and second green sheets so as to superpose the top surface of the first green sheet and the under surface of the second green sheet and bonding and firing the first and second green sheets together.

2. The method for producing the wavelength conversion member according to claim 1, wherein the wavelength conversion member includes a plurality of regions each having a concentration of the phosphor particles decreasing from a side closer to the first principal surface toward a side closer to the second principal surface and the plurality of regions are continuously provided from the first principal surface toward the second principal surface.

3. The method for producing the wavelength conversion member according to claim 1, further comprising the step of polishing the first principal surface and/or the second principal surface of the wavelength conversion member.

4. The method for producing the wavelength conversion member according to claim 1, wherein after obtaining a plurality of green sheets, including at least the first and second green sheets, in each of which a concentration of the phosphor particles in an under surface is higher than a concentration of the phosphor particles in a top surface during the step of obtaining the first and second green sheets, stacking and bonding and firing the plurality of green sheets together.

\* \* \* \* \*